US007007252B2

(12) United States Patent
Gyure et al.

(10) Patent No.: US 7,007,252 B2
(45) Date of Patent: *Feb. 28, 2006

(54) METHOD AND APPARATUS FOR CHARACTERIZING THE PROPAGATION OF NOISE THROUGH A CELL IN AN INTEGRATED CIRCUIT

(75) Inventors: Alexander Gyure, San Jose, CA (US); Jindrich Zejda, Sunnyvale, CA (US); Peivand Fallah-Tehrani, Camarillo, CA (US); Wenyuan Wang, Fremont, CA (US); Chi-Chong Lo, San Jose, CA (US); Mahmoud Shahram, Cupertino, CA (US); Yansheng Luo, Fremont, CA (US); William Chiu-Ting Shu, Palo Alto, CA (US); Seyed Alireza Kasnavi, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 299 days.

This patent is subject to a terminal disclaimer.

(21) Appl. No.: 10/410,903

(22) Filed: Apr. 9, 2003

(65) Prior Publication Data

US 2004/0205680 A1 Oct. 14, 2004

(51) Int. Cl.
*G06F 17/50* (2006.01)
*G06F 19/00* (2006.01)
*G01R 31/28* (2006.01)
*G01R 27/28* (2006.01)
*G01R 29/00* (2006.01)

(52) U.S. Cl. .............................. 716/5; 716/17; 703/16; 703/2; 702/111; 702/124; 702/191; 714/32; 324/527; 324/537; 324/613; 324/615

(58) Field of Classification Search .................... 716/5, 716/17; 703/16, 2; 702/111, 124, 191; 714/32; 324/527, 537, 613, 615
See application file for complete search history.

(56) References Cited

U.S. PATENT DOCUMENTS

| 5,091,872 A | * | 2/1992 | Agrawal ...................... 703/14 |
| 5,471,397 A | * | 11/1995 | Hsieh et al. ................... 716/5 |
| 5,568,395 A | * | 10/1996 | Huang ........................... 716/4 |
| 5,652,715 A | * | 7/1997 | Hanson ...................... 702/191 |
| 5,706,206 A | * | 1/1998 | Hammer et al. ............... 716/4 |

(Continued)

FOREIGN PATENT DOCUMENTS

WO WO 3105030 A1 * 12/2003

OTHER PUBLICATIONS

Liu et al., "A Delay Metric for RC Circuits Based on the Weibull Distribution", IEEE/ACM International Conference on Computer-Aided Design, Nov. 10, 2002, pp. 620-624.*

(Continued)

*Primary Examiner*—Matthew Smith
*Assistant Examiner*—Phallaka Kik
(74) *Attorney, Agent, or Firm*—Park, Vaughan & Fleming LLP

(57) ABSTRACT

One embodiment of the invention provides a system that characterizes cells within an integrated circuit. During operation, the system obtains a number of input noise signals to be applied to the cell. The system then simulates responses of the cell to each of the input noise signals, and stores a representation of the responses. This allows a subsequent analysis operation to access the stored representation to determine a response of the cell instead of having to perform a time-consuming simulation operation.

22 Claims, 6 Drawing Sheets

U.S. PATENT DOCUMENTS

| | | | | |
|---|---|---|---|---|
| 5,999,714 | A * | 12/1999 | Conn et al. | 716/2 |
| 6,018,623 | A * | 1/2000 | Chang et al. | 716/6 |
| 6,028,989 | A * | 2/2000 | Dansky et al. | 716/8 |
| 6,112,161 | A * | 8/2000 | Dryden et al. | 702/85 |
| 6,208,950 | B1 * | 3/2001 | Chiba | 702/191 |
| 6,490,708 | B1 * | 12/2002 | Cohn et al. | 716/4 |
| 6,493,853 | B1 * | 12/2002 | Savithri et al. | 716/5 |
| 6,571,202 | B1 * | 5/2003 | Loman et al. | 703/2 |
| 6,615,162 | B1 * | 9/2003 | Bar-Or | 702/191 |
| 6,732,339 | B1 * | 5/2004 | Savithri et al. | 716/4 |
| 6,826,736 | B1 * | 11/2004 | Wu et al. | 716/5 |
| 6,868,534 | B1 * | 3/2005 | Fattouh et al. | 716/6 |
| 6,915,249 | B1 * | 7/2005 | Sato et al. | 703/14 |
| 6,925,624 | B1 * | 8/2005 | Komoda | 716/10 |
| 6,941,258 | B1 * | 9/2005 | Van Heijningen et al. | 703/16 |
| 2002/0022951 | A1 * | 2/2002 | Heijningen et al. | 703/16 |
| 2002/0133791 | A1 * | 9/2002 | Cohn et al. | 716/4 |
| 2003/0079191 | A1 * | 4/2003 | Savithri et al. | 716/4 |
| 2003/0145296 | A1 * | 7/2003 | Chandra et al. | 716/6 |
| 2003/0154065 | A1 * | 8/2003 | Gauthier et al. | 703/14 |
| 2003/0191619 | A1 * | 10/2003 | Davies et al. | 703/14 |
| 2003/0229481 | A1 * | 12/2003 | Wu et al. | 703/14 |
| 2004/0117162 | A1 * | 6/2004 | Ozis et al. | 703/2 |
| 2004/0205680 | A1 * | 10/2004 | Gyure et al. | 716/4 |
| 2004/0205682 | A1 * | 10/2004 | Gyure et al. | 716/5 |
| 2004/0243952 | A1 * | 12/2004 | Croix | 716/4 |

OTHER PUBLICATIONS

Kim et al., "Noise-Wave Interconnect Power Optimization in Domino Logic Synthesis", IEEE Transactions on Very Large Scale Integration (VLSI) Systems, vol. 11, No. 1, Feb. 2002, pp. 79-89.*

Bello et al., "Modeling a Verification Test System for Mixed-Signal Circuits", IEEE Design & Test of Computers, vol. 18, No. 1, Jan. 2001, pp. 63-71.*

Kim et al., "Noise-Aware Power Optimization for On-Chip Interconnect", Proceedings of the 2000 International Symposium on Low Power Electronics and Design, 2000, pp. 108-113.*

Demir et al., "Modeling and Simulation of the Interference Due to Digital Switching in Mixed-Signal ICs", 1999 IEEE/ACM International Conference on Computer-Aided Design, Nov. 7, 1999, pp. 70-74.*

Wang et al., "Using Weibull Density Function in Importance Sampling for Digital Communication System Simulation", IEE Proceedings I on Communications, Speech and Vision, vol. 140, No. 2, Apr. 1993, pp. 163-168.*

Johnson, "Constructions on Particular Random Processes", Proceedings of the IEEE, vol. 82, No. 2, Feb. 1994, pp. 270-285.*

NB8106491, "Current Switch Receiver Circuit with Improved AC Tolerance", vol. 24, No. 1B, Jun. 1981, pp. 491-491 (3 pages).*

NA82081096, "Peak Detection Circuit", IBM Technical Disclosure Bulletin, vol. 25, No. 3A, Aug. 1982, p. 1096 (3 pages).*

* cited by examiner

METHOD AND APPARATUS FOR CHARACTERIZING THE PROPAGATION OF NOISE THROUGH A CELL IN AN INTEGRATED CIRCUIT

RELATED APPLICATION

The subject matter of this application is related to the subject matter in a co-pending non-provisional application by the same inventors as the instant application and filed on the same day as the instant application entitled, "Method and Apparatus for Detecting and Analyzing the Propagation of Noise Through an Integrated Circuit," having Ser. No. 10/410,919, and filing date 9 Apr. 2003.

BACKGROUND

1. Field of the Invention

The invention relates to techniques for modeling the performance of electrical circuits. More specifically, the invention relates to a method and an apparatus that uses a cell-level model to characterize and analyze the propagation of noise through an integrated circuit.

2. Related Art

Advances in semiconductor fabrication technology continue to decrease the minimum feature size that is attainable on an integrated circuit. This allows larger amounts of circuitry to be incorporated onto a single semiconductor die. At the same time, increasing clock speeds are causing this circuitry to switch at increasingly faster rates. Both of these factors are increasing the significance of noise caused by capacitive coupling between adjacent signal lines, and by inductive effects on long signal lines. Moreover, decreasing power supply voltages dictate lower transistor threshold voltages, and therefore smaller noise margins, which causes a significantly reduced signal-to-noise ratio for both digital circuits and mixed analog/digital circuits.

The above-described factors can cause "noise glitches" to be induced in signals lines within integrated circuits. These noise glitches can cause timing degradation in switching nodes, or can cause false transitions in steady-state "quiet" nodes. These false transitions can propagate through the circuit, and can cause functional errors or failures.

It is important to be able to accurately detect these noise-induced errors before a semiconductor chip is fabricated. Otherwise, a chip may not function properly, and it may be necessary to perform a "mask re-spin," which can cost hundreds of thousands (or possibly millions) of dollars and can significantly delay the release of a product.

Circuit designers typically use timing simulators that operate on a computer-based model of a circuit to simulate the timing of the circuit. The results of these timing simulations are used to verify that the circuit meets timing requirements, and if not, to adjust the design of the circuit. Unfortunately, these timing simulations are presently unable to accurately simulate "noise glitches" over a large number of circuit elements.

General-purpose circuit simulators, such as SPICE™, can be used to accurately model noise glitches. However, such general-purpose circuit simulators are computationally intensive, and consequently require a significant amount of time to model noise on a small number of circuit elements. This makes it impractical to simulate the effects of noise on larger circuits.

Hence, what is needed is a method and an apparatus for accurately and efficiently modeling the effects of electrical noise on larger circuits.

SUMMARY

One embodiment of the invention provides a system that analyzes the propagation of noise through an integrated circuit. During operation, the system obtains an input noise signal to be applied to a cell within the integrated circuit. The system then looks up parameters specifying how noise affects the cell, and then uses the parameters to determine how the input noise signal affects the cell.

In a variation on this embodiment, determining how the input noise signal affects the cell involves determining if the input noise signal will cause the cell to fail. This can involve using a noise immunity curve for the cell, which indicates whether a given input noise signal will cause a functional failure in the cell. Note that the noise immunity curve can be represented as equation coefficients or tables.

In a variation on this embodiment, determining how the input noise signal affects the cell involves determining a propagated noise signal that emanates from the cell. In doing so, the system can use parameters for a given cell that relate input glitch height, input glitch width and output load (and possibly time-to-peak of the input glitch) to output glitch height and output glitch width (and possibly time-to-peak of the output glitch). Also note that the system can additionally determine if the propagated noise signal will cause a downstream cell to fail.

In a variation on this embodiment, obtaining the input noise signal to be applied to the cell involves determining a coupling glitch on a victim net caused by a transition on a neighboring aggressor net. This coupling glitch can be combined with a propagated noise signal received from an upstream cell to produce the input noise signal.

One embodiment of the invention provides a system that characterizes cells within an integrated circuit. During operation, the system obtains a number of input noise signals to be applied to the cell. The system then simulates responses of the cell to each of the input noise signals, and stores a representation of the responses. This allows a subsequent analysis operation to access the stored representation to determine a response of the cell instead of having to perform a time-consuming simulation operation.

In a variation on this embodiment, the representation describes a noise immunity curve for the cell, which indicates whether a given input noise signal will cause a functional failure in the cell. For a given input glitch width, this noise immunity curve indicates a maximum input glitch height that can be tolerated by the cell without causing a functional failure. Note that the representation of the noise immunity curve can comprise equation coefficients representing the noise immunity curve. These equation coefficients can be generated by gathering responses for selected noise input signals, and then using the responses to perform a curve-fitting operation for a hyperbolic function representing the noise immunity curve.

In a variation on this embodiment, the representation of the responses comprise a lookup table, which can be used to determine a propagated glitch for the cell based upon an input glitch for the cell. This lookup table can relate input glitch height, input glitch width and output load (and possibly time-to-peak of the input glitch) to output glitch height and output glitch width (and possibly time-to-peak of the output glitch).

In a variation on this embodiment, obtaining a given noise input signal involves representing the given noise input signal as a triangular glitch with RC smoothing.

In a variation on this embodiment, obtaining a given noise input signal involves representing the given noise input signal as a glitch described by a Weibull equation.

DETAILED DESCRIPTION

Modeling Noise

Figure 1:
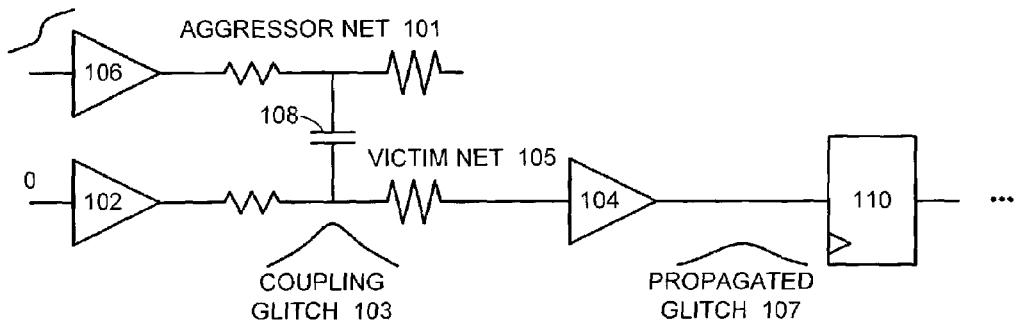
FIG. 1 illustrates how noise can be modeled in accordance with an embodiment of the invention.

FIG. 1 illustrates how noise can be modeled in accordance with an embodiment of the invention. As is illustrated in FIG. 1, there is capacitive (and possibly inductive) coupling 108 between an aggressor net 101 and a neighboring victim net 105. Because of this coupling, a transition on aggressor net 101 induces a "coupling glitch" 103 on victim net 105. Note that the I/V characteristics of an upstream driver 102, as well as the load on victim net 105 affect the size and shape of this coupling glitch 103.

Coupling glitch 103 feeds into a driver 104. If coupling glitch 103 has sufficient energy, it can cause a propagated glitch 107 at the output of driver 104. This propagated glitch 107 can possibly cause a functional failure in a downstream cell 110. Note that coupling glitch 103 can also combine with a propagated glitch from upstream driver 102 to generate an input noise signal for driver 104.

Drivers 102 and 104 and cell 110 can generally be any type of cell within an integrated circuit, such as a logic gate or a memory element. One advantage of the invention is that noise is calculated at the "cell level" using lookup tables, wherein a cell is comprised of a number of lower-level circuit elements, such as transistors. This saves a considerable amount of time over having to perform numerical simulations on larger numbers of lower-level circuit elements.

Figure 2A:
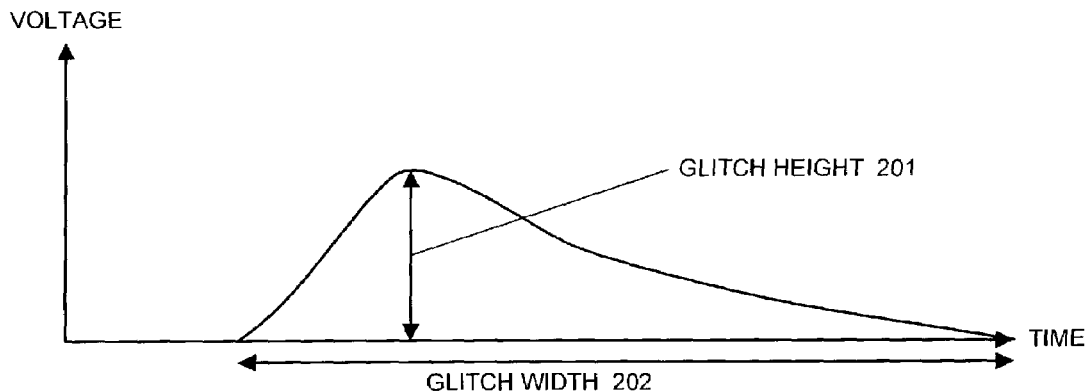
FIG. 2A illustrates a noise glitch in accordance with an embodiment of the invention.

FIG. 2A illustrates an exemplary noise glitch in accordance with an embodiment of the invention. As is illustrated in FIG. 2, this exemplary noise glitch has an associated glitch height 201 and a glitch width 202.

Figure 2B:
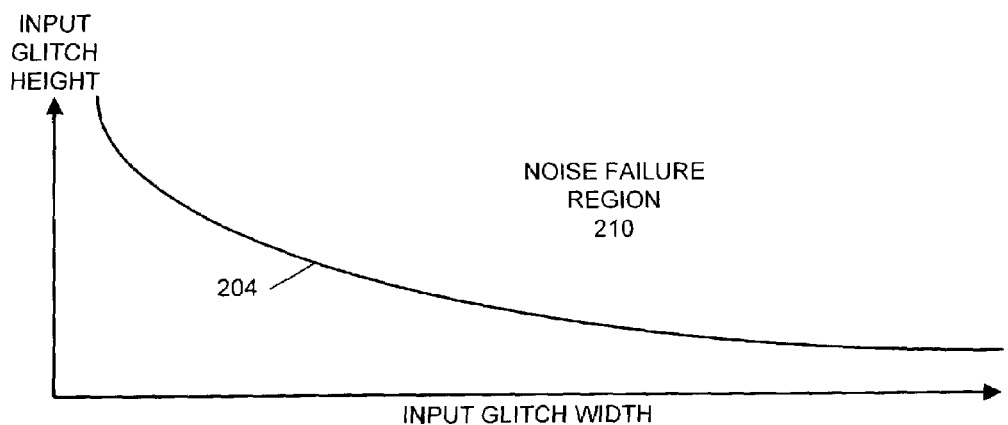
FIG. 2B illustrates a noise immunity curve in accordance with an embodiment of the invention.

FIG. 2B illustrates a noise immunity curve 204 in accordance with an embodiment of the invention. Note that this immunity curve is associated with a specific cell and a specific output load on the cell. For a given glitch width, noise immunity curve 204 indicates a minimum glitch height that causes a failure in the given cell. Glitches that fall above noise immunity curve 204 in noise failure region 210 generate failures, whereas glitches that fall below noise immunity curve 204 do not cause failures.

Noise Glitches

Figure 3A:
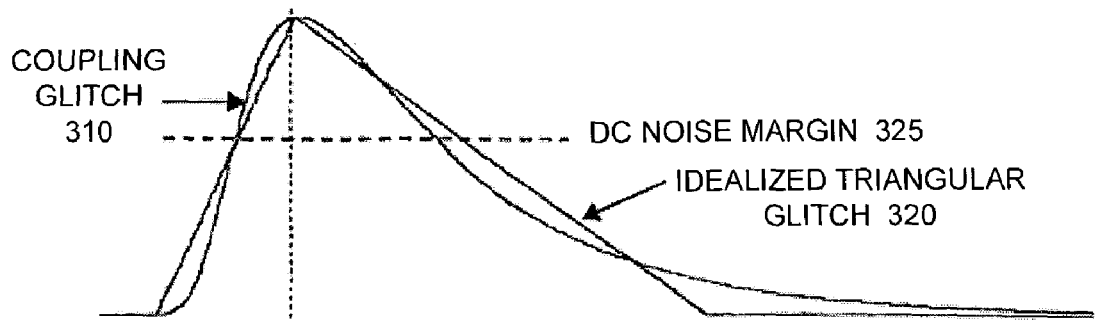
FIG. 3A compares a triangular glitch with a real coupling glitch in accordance with an embodiment of the invention.

As is illustrated in FIG. 3A, a coupling glitch 310 can be approximated by an idealized triangular glitch 320. Note that coupling glitch 310 and idealized triangular glitch 320 have the same maximum amplitudes, and that both curves exceed DC noise margin 325. Hence, each curve will cause a corresponding propagated glitch at the cell output as is illustrated in FIG. 3B.

Figure 3B:
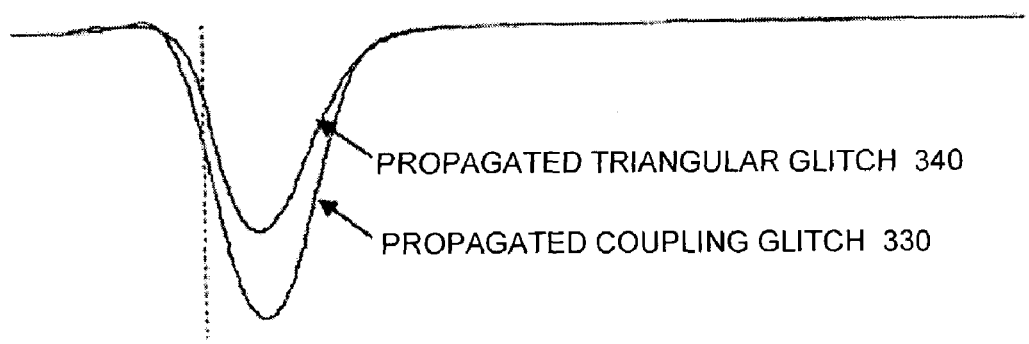
FIG. 3B compares the resulting propagated glitch for smoothed triangular and real coupling glitches in accordance with an embodiment of the invention.

In FIG. 3B, note that the propagated coupling glitch 330 has a greater magnitude that propagated triangular glitch 340. This is because the energy (or effective area) above the DC noise margin for coupling glitch 310 is larger than for idealized triangular glitch 320.

Triangular Glitch Model

Figure 4:
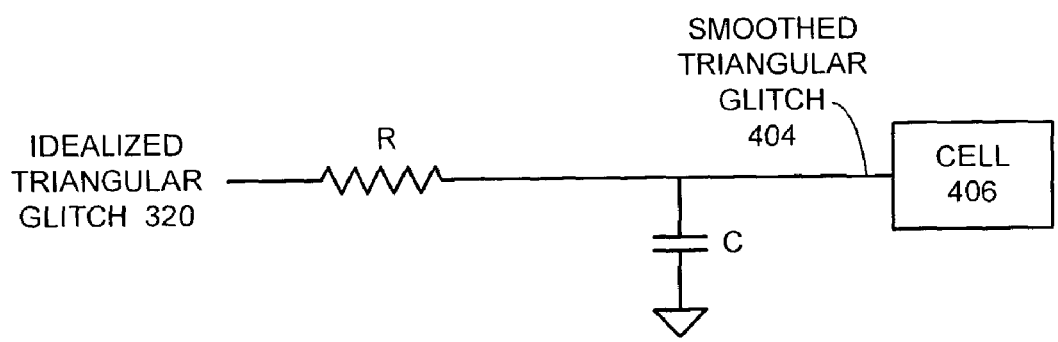
FIG. 4 illustrates an RC smoothing circuit in accordance with an embodiment of the invention.

In order to remedy this problem, idealized triangular glitch 320 can be "smoothed" by feeding idealized triangular glitch 320 through an RC filter (as is illustrated in FIG. 4) to produce a smoothed triangular glitch 404. Note that the process of modeling propagation of a signal through an RC filter can be performed using well-known techniques without an unacceptable computational burden.

Figure 5A:
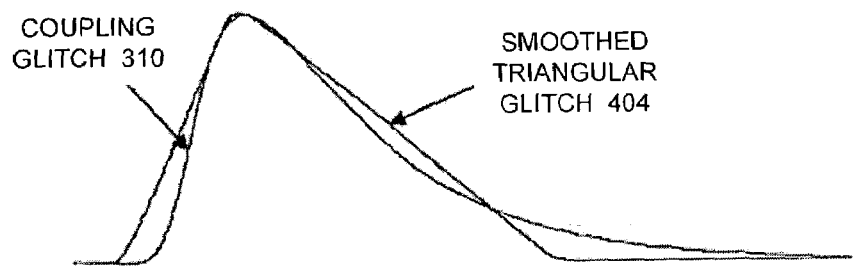
FIG. 5A compares a smoothed triangular glitch with a real coupling glitch in accordance with an embodiment of the invention.
Figure 5B:
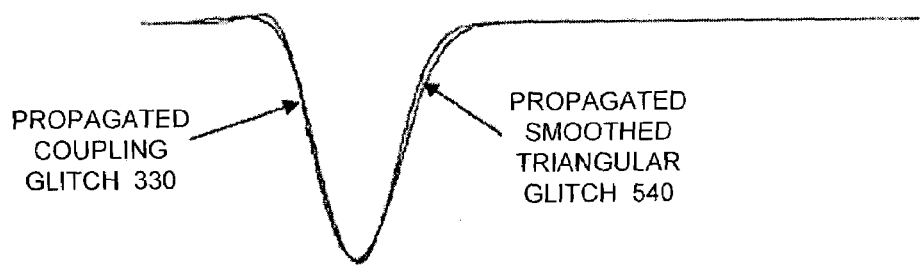
FIG. 5B compares the resulting propagated smoothed triangular glitch and propagated coupling glitch in accordance with an embodiment of the invention.

Referring to FIG. 5A, the resulting smoothed triangular glitch 404 closely approximates coupling glitch 310, and the resulting propagated smoothed triangular glitch 540 closely tracks propagated coupling glitch 330.

Weibull Glitch Model

Further improvements in the accuracy of output noise modeling can be achieved by using the Weibull function to model the input noise glitch. A Weibull function can be used to define noise glitch voltage as a function of time as follows.

$$v(t) = a\left(\frac{c-1}{c}\right)^{\frac{1-c}{c}}\left[\frac{t-x_0}{b} + \left(\frac{c-1}{c}\right)^{\frac{1}{c}}\right]^{c-1} \exp^{-\left[\frac{t-x_0}{b} + \left(\frac{c-1}{c}\right)^{\frac{1}{c}}\right]^c} + \frac{c-1}{c}$$

There are four parameters, a, b, c, $x_0$, which are defined as follows.

a is the glitch peak;

$x_0$ is the peak time of the waveform. Note that $x_0$ is equivalent to time-to-peak of the waveform when the waveform starts from zero.

c is a shape coefficient which can be derived from the waveform's time-to-peak over width ratio (t2p_ratio), i.e., $$c = \frac{1}{1 + \ln(1 - t2p\_ratio)};$$

b is a glitch width coefficient, $$b = \text{glitch\_width} * \frac{c}{2} * \left(\frac{c-1}{c}\right)^{\frac{c-1}{c}} * \exp\left(\frac{1-c}{c}\right).$$

So for a given c, b can be calculated as b=const.*glitch_width. Note that y is constrained to be $\geq 0$.

To further improve the accuracy of the Weibull function in modeling an input glitch, the shape coefficient, c, can be derived through SPICE optimization based on a series of simulated glitches (of varying height and width and time to peak) generated from a distributed RC coupling network.

This can be done as follows. For each real coupling glitch, set the Weibull glitch to have the same height and width as the real glitch. Then perform a SPICE circuit optimization to search for the best value of c, where the height and width of the propagated glitch resulting from the Weibull glitch is identical to the height and width of the propagated glitch resulting from the real glitch.

Experiments show that for real coupling glitches of varying heights and widths, the optimized c value remains in a very narrow range. So an average of the optimized c value can be used for all Weibull input glitches for a given technology.

Note that the invention is not limited to the glitch models described above. In general, it is possible to use any glitch model with the invention. For example, a trapezoidal shape approximation glitch model can be used instead of the above-described glitch models.

Process of Determining a Noise Immunity Curve

Figure 6:
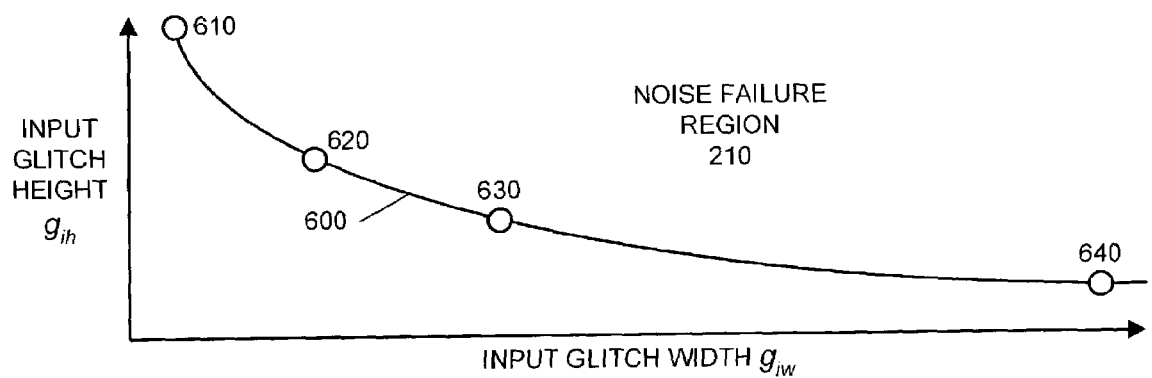
FIG. 6 illustrates data points along a noise immunity curve in accordance with an embodiment of the invention.
Figure 7:
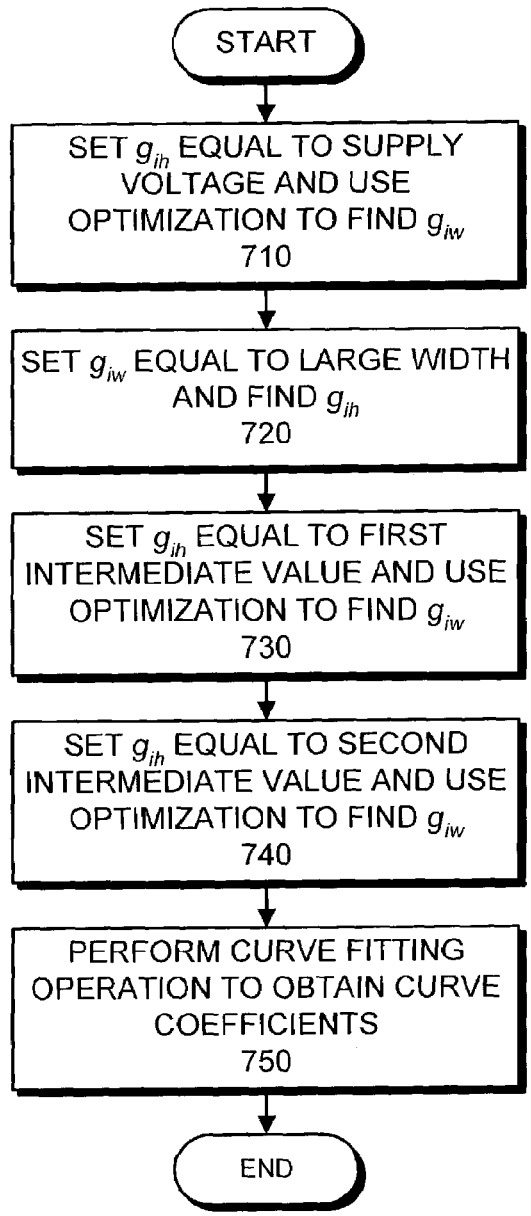
FIG. 7 presents a flow chart illustrating the process of determining a noise immunity curve for a given cell in accordance with an embodiment of the invention.

The noise immunity curve for a given cell can be determined by applying a curve fitting technique to a number of points along a noise immunity curve (exemplary points are illustrated in FIG. 6). Referring to the flow chart in FIG. 7, the system obtains a first point 610 by setting the input glitch height, $g_{ih}$, to the supply voltage, and then performing an optimization involving a number of SPICE simulations (or by using some other circuit simulator) on a number of glitch widths to find the corresponding minimum glitch width that results in a cell failure (step 710). Note that a binary search can be used to speed up this process.

Next, the system obtains a second point 640 on noise immunity curve 600 by setting the glitch width, $g_{iw}$, to a large value (such as 4 ns), and the performing a similar optimization to find a corresponding glitch height, $g_{ih}$, on noise immunity curve 600 (step 720).

Next, the system obtains a third point on noise immunity curve 600 by setting the glitch height, $g_{ih}$, to a first intermediate value between the glitch height of point 610 and the glitch height of point 640, and then performing an optimization to find a corresponding glitch height, $g_{ih}$ (step 730).

Next, the system obtains a fourth point on noise immunity curve 600 by setting the glitch height, $g_{ih}$, to a second intermediate value between the glitch height of point 610 and the glitch height of point 640, and then performing an optimization to find a corresponding glitch height, $g_{ih}$ (step 740).

Finally, the system uses a curve-fitting technique to obtain coefficients of a curve passing through points 610, 620, 630 and 640 (step 750). For example, noise immunity curve 600 can be modeled as a hyperbolic function $$g_{ih} = c_1 + c_2/(g_{iw} + c_3),$$

and the curve-fitting technique can be used to obtain the coefficients $c_1$, $c_2$ and $c_3$.

Process of Producing a Propagation Table

Figure 8:
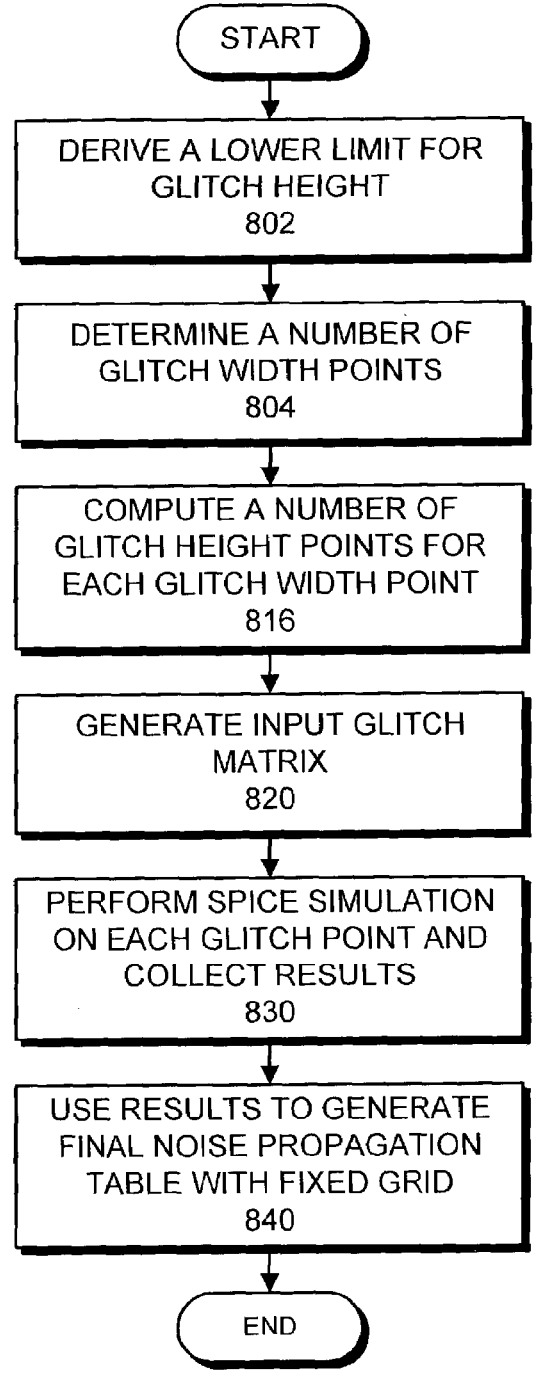
FIG. 8 presents a flow chart illustrating the process of determining values in a noise propagation table for a given cell in accordance with an embodiment of the invention.

FIG. 8 presents a flow chart illustrating a process of determining values in a noise propagation table for a given cell in accordance with an embodiment of the invention. The noise propagation table for a given cell allows a subsequent analysis operation to rapidly determine characteristics of an output glitch for the given cell based on characteristics of a corresponding input glitch. In one embodiment of the invention, the noise propagation table relates input glitch height, input glitch width and output load (and possibly time-to-peak of the input glitch) to output glitch height and output glitch width (and possibly time-to-peak of the output glitch).

In building the noise propagation table, the system first builds an input glitch matrix. In one embodiment of the invention, this involves deriving a lower limit for the glitch height, for example from the DC noise margin of the cell (step 802). The upper limit for the glitch height is taken to be the supply voltage. Next, a desired number of glitch width points is determined (for example 15) based upon the linearity of the noise rejection curve (step 804). For example, glitch width may be calculated for every 5% of a glitch height in a non-linear region, and for every 10% of glitch height in a linear region, as defined by predetermined linearity criteria.

Next, the system computes a number of glitch height points for each glitch width point (step 816). For example, the system can compute 15 evenly spaced glitch height points between the upper and lower glitch height limits.

The system subsequently generates an input glitch matrix with the determined number of glitch width points and glitch height points (step 820). In one embodiment of the invention, a triangular input waveform is passed through an RC pre-driver circuit as is illustrated in FIG. 4 to produce a smoothed triangular waveform. While passing through the RC pre-driver circuit, the height and width of the idealized triangular waveform are modified. Hence, in order to achieve a desired glitch height and width for the resulting smoothed triangular waveform at the output of the RC pre-driver circuit, a reverse transform for RC pre-driver circuit is solved to calculate the corresponding idealized triangular glitch height and width at the input of the RC pre-driver circuit.

Next, the system performs a circuit simulation (for example, using SPICE) for each point in the matrix and the results are collected (step 830). This produces a raw noise propagation table, which does not have a fixed grid due to small variations in the accuracy of the reverse transform.

Finally, the system uses the raw noise propagation table to generate a final noise propagation table with a fixed grid (step 840). During this process, small width variations can be eliminated by through averaging and/or interpolation.

Process of Analyzing Noise

Figure 9:
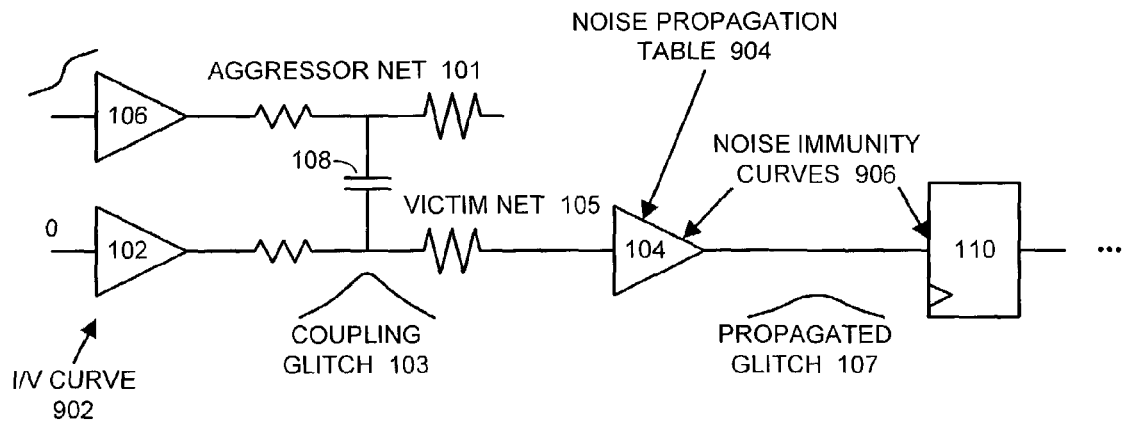
FIG. 9 illustrates how curves and tables are used to efficiently analyze the effects of noise in accordance with an embodiment of the invention.

FIG. 9 illustrates how curves and tables are used to efficiently analyze the effects of noise in accordance with an embodiment of the invention. The I/V curve for driver 102 and the load on victim net 105 are used to determine the magnitude of a coupling glitch 103 that is caused by a transition on aggressor net 101. This I/V curve for driver 102 can be stored as a table (or a function) that relates current to voltage at the output of driver 102.

Next, coupling glitch 103 is applied to driver 104. Noise propagation table 904 for driver 104 along with related functions are used to determine a resulting propagated glitch 107 at the output of driver 104. In one embodiment of the present invention, noise propagation table 904 includes entries that relate input glitch height, input glitch width and output load (and possibly time-to-peak of the input glitch) to output glitch height and output glitch width (and possibly time-to-peak of the output glitch). Next, propagated glitch 107 can possibly be combined with another coupling glitch induced by aggressor net 101 to produce an input noise signal for downstream cell 110.

Noise immunity curves 906 are then used to determine whether the input noise signals for cells 104 and 110 will cause the cells to fail. If so, the system flags these failures. Recall that for a given output load and a given input glitch width, a noise immunity curve indicates a maximum input glitch height that can be tolerated by the cell without causing a functional failure in the cell. Also recall that the noise immunity curve can be stored as coefficients for a function that describes the noise immunity curve.

Figure 10:
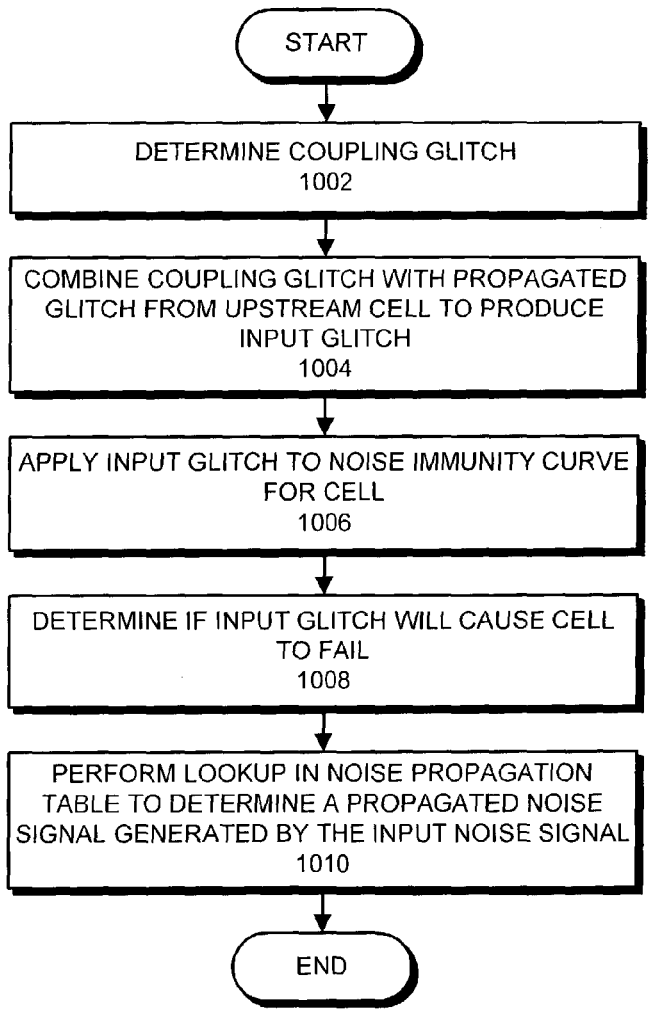
FIG. 10 presents a flow chart illustrating how noise is analyzed in accordance with an embodiment of the invention.

The above-described analysis process is described in more detail with reference to FIG. 10, which presents a flow chart illustrating how noise is analyzed. For a given cell 104 the system determines a coupling glitch 103 at the input to cell 104 by using one of the above-described glitch models (and possibly using the I/V curve for upstream driver 102) (step 1002). This coupling glitch can optionally be combined with a propagated glitch received from an upstream cell to produce an input glitch for cell 104 (step 1004).

The system then applies the input glitch to the noise immunity curve 906 for cell 104 (step 1006). This allows the system to determine if the input glitch will cause a functional failure within cell 104 (step 1008). (This process is described in more detail below with reference to FIG. 11.) If so, the system flags the failure.

The system also performs a lookup based on the input glitch in noise propagation table 904 for cell 104. This lookup returns a propagated glitch from cell 104, which can be combined with another coupling glitch to form an input glitch for downstream cell 110 (step 1010).

Figure 11:
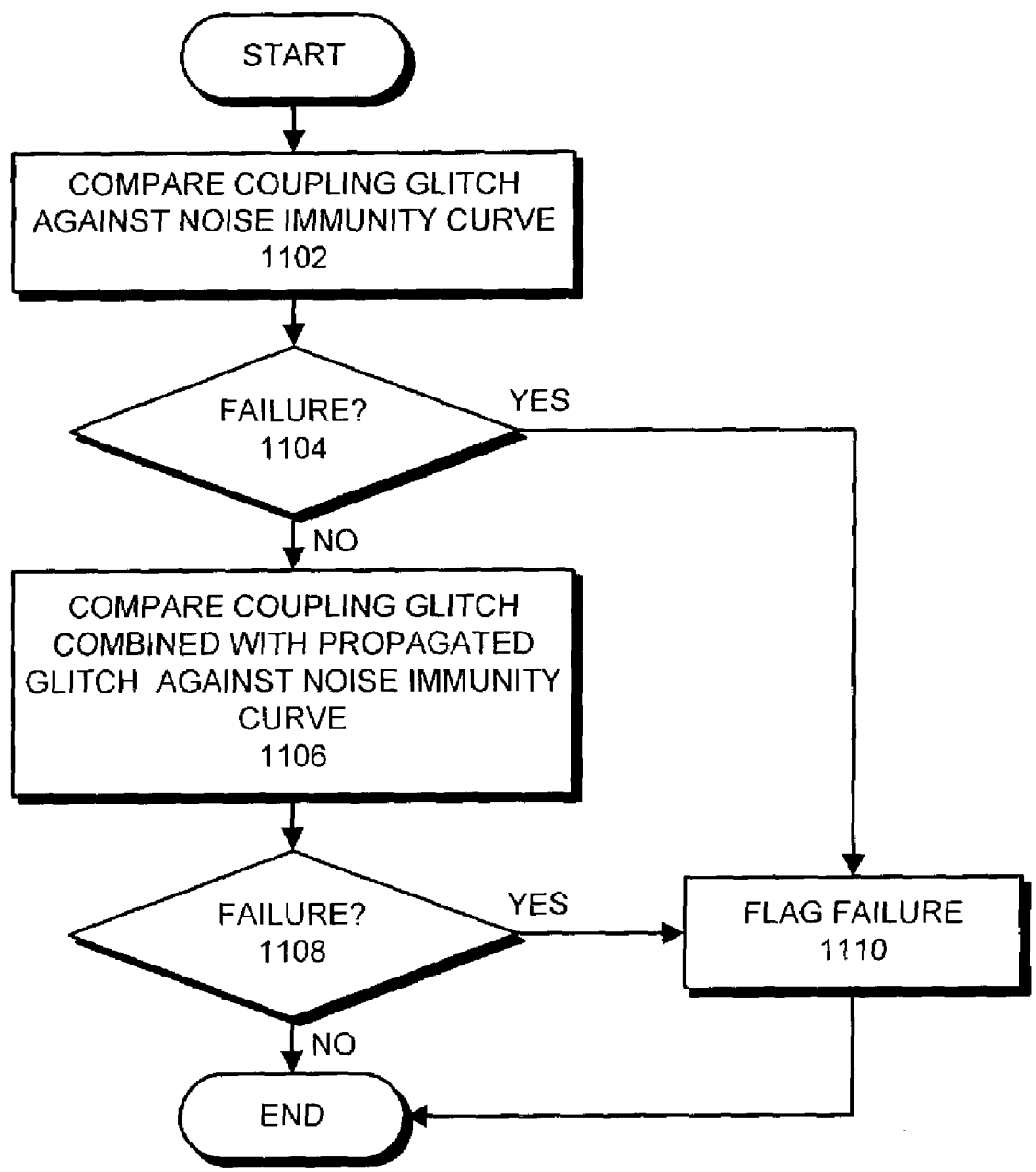
FIG. 11 presents a flow chart illustrating how a cell failure is detected in accordance with an embodiment of the invention.

FIG. 11 presents a flow chart illustrating how a cell failure is determined in accordance with an embodiment of the invention. As a default, coupling glitch 103 can be compared against the DC noise margin for the cell to determine whether the cell will fail. Otherwise, the coupling glitch 103 can be compared against the noise immunity curve for the cell (step 1102). This allows the system to determine if the coupling glitch 103 will cause a failure in the cell (step 1104). If, so the system flags the failure (step 1110). Otherwise, the system combines the coupling glitch 103 with a propagated glitch from an upstream cell and compares the combined glitch against the noise immunity curve (step 1106). This allows the system to determine if the combined glitch will cause a failure in the cell (step 1108). If so, the system goes to step 1110 to flag the failure. Otherwise, the system can proceed to analyze remaining cells.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

What is claimed is:

1. A method for characterizing a cell within an integrated circuit, comprising:

obtaining a number of input noise signals to be applied to the cell;

simulating responses of the cell to each of the input noise signals; and storing a representation of the responses, whereby a subsequent analysis operation accesses the stored representation to determine a response of the cell instead of having to perform a time-consuming simulation operation;

wherein the representation of the responses is a lookup table, which is used to determine a propagated glitch for the cell based upon an input glitch for the cell; and wherein the lookup table relates input glitch height, input glitch width, time-to-peak of the input glitch and output load to output glitch height, output glitch width and time-to-peak of an output glitch.

2. The method of claim 1, wherein the representation describes a noise immunity curve for the cell, which indicates whether a given input noise signal will cause a functional failure in the cell.

3. The method of claim 2, wherein for a given input glitch width, the noise immunity curve indicates a maximum input glitch height that is tolerated by the cell without causing a functional failure.

4. The method of claim 3, wherein the representation of the noise immunity curve comprises equation coefficients representing the noise immunity curve.

5. The method of claim 4, wherein the equation coefficients are generated by:

gathering responses for selected noise input signals; and using the responses to perform a curve-fitting operation for a hyperbolic function representing the noise immunity curve.

6. The method of claim 1, wherein obtaining the number of noise input signals involves representing a given noise input signal as a triangular glitch with RC smoothing.

7. The method of claim 1, wherein obtaining the number of noise input signals involves representing a given noise input signal as a glitch described by a Weibull equation.

8. A computer-readable storage medium storing instructions that when executed by a computer cause the computer to perform a method for characterizing a cell within an integrated circuit, the method comprising:

obtaining a number of input noise signals to be applied to the cell;

simulating responses of the cell to each of the input noise signals; and storing a representation of the responses, whereby a subsequent analysis operation accesses the stored representation to determine a response of the cell instead of having to perform a time-consuming simulation operation;

wherein the representation of the responses is a lookup table, which is used to determine a propagated glitch for the cell based upon an input glitch for the cell; and wherein the lookup table relates input glitch height, input glitch width, time-to-peak of the input glitch and output load to output glitch height, output glitch width and time-to-peak of an output glitch.

9. The computer-readable storage medium of claim 8, wherein the representation describes a noise immunity curve for the cell, which indicates whether a given input noise signal will cause a functional failure in the cell.

10. The computer-readable storage medium of claim 9, wherein for a given input glitch width, the noise immunity curve indicates a maximum input glitch height that is tolerated by the cell without causing a functional failure.

11. The computer-readable storage medium of claim 10, wherein the representation of the noise immunity curve comprises equation coefficients representing the noise immunity curve.

12. The computer-readable storage medium of claim 11, wherein the equation coefficients are generated by:

gathering responses for selected noise input signals; and using the responses to perform a curve-fitting operation for a hyperbolic function representing the noise immunity curve.

13. The computer-readable storage medium of claim 8, wherein obtaining the number of noise input signals involves representing a given noise input signal as a triangular glitch with RC smoothing.

14. The computer-readable storage medium of claim 8, wherein obtaining the number of noise input signals involves representing a given noise input signal as a glitch described by a Weibull equation.

15. An apparatus that characterizes a cell within an integrated circuit, comprising:

an input generator configured to generate a number of input noise signals to be applied to the cell;

a simulator configured to simulate responses of the cell to each of the input noise signals; and a storage mechanism configured to store a representation of the responses, whereby a subsequent analysis operation accesses the stored representation to determine a response of the cell instead of having to perform a time-consuming simulation operation;

wherein the representation of the responses is a lookup table, which is used to determine a propagated glitch for the cell based upon an input glitch for the cell; and wherein the lookup table relates input glitch height, input glitch width, time-to-peak of the input glitch and output load to output glitch height, output glitch width and time-to-peak of an output glitch.

16. The apparatus of claim 15, wherein the representation describes a noise immunity curve for the cell, which indicates whether a given input noise signal will cause a functional failure in the cell.

17. The apparatus of claim 16, wherein for a given input glitch width, the noise immunity curve indicates a maximum input glitch height that is tolerated by the cell without causing a functional failure.

18. The apparatus of claim 17, wherein the representation of the noise immunity curve comprises equation coefficients representing the noise immunity curve.

19. The apparatus of claim 18, further comprising a processing mechanism, which is configured to generate the equation coefficients by:

gathering responses for selected noise input signals; and using the responses to perform a curve-fitting operation for a hyperbolic function representing the noise immunity curve.

20. The apparatus of claim 15, wherein while generating the number of noise input signals, the input generator is configured to represent a given noise input signal as a triangular glitch with RC smoothing.

21. The apparatus of claim 15, wherein while generating the number of noise input signals, the input generator is configured to represent a given noise input signal as a glitch described by a Weibull equation.

22. A means for characterizing a cell within an integrated circuit, comprising:

a means for generating a number of input noise signals to be applied to the cell;

a means for simulating responses of the cell to each of the input noise signals; and a means for storing a representation of the responses, whereby a subsequent analysis operation accesses the stored representation to determine a response of the cell instead of having to perform a time-consuming simulation operation;

wherein the representation of the responses is a lookup table, which is used to determine a propagated glitch for the cell based upon an input glitch for the cell; and wherein the lookup table relates input glitch height, input glitch width, time-to-peak of the input glitch and output load to output glitch height, output glitch width and time-to-peak of an output glitch.

* * * * *